(12) United States Patent
Wakabayashi

(10) Patent No.: US 6,607,970 B1
(45) Date of Patent: Aug. 19, 2003

(54) SEMICONDUCTOR DEVICE AND METHOD OF MANUFACTURING THE SAME

(75) Inventor: Takeshi Wakabayashi, Sayama (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/704,156

(22) Filed: Nov. 1, 2000

(30) Foreign Application Priority Data

Nov. 11, 1999 (JP) .............................................. 11-321416

(51) Int. Cl.$^7$ ............................................ H01L 21/301
(52) U.S. Cl. ...................... 438/462; 438/458; 438/113; 438/115; 438/114; 438/464; 257/620; 257/622; 257/623; 257/618
(58) Field of Search ................................. 257/620, 618, 257/622, 623, 737, 780, 779; 438/114, 115, 113, 458, 462, 464

(56) References Cited

U.S. PATENT DOCUMENTS

| | | | |
|---|---|---|---|
| 5,155,068 A | | 10/1992 | Tada |
| 5,888,883 A | * | 3/1999 | Sasaki et al. ................. 438/460 |
| 5,977,641 A | | 11/1999 | Takashashi et al. |
| 5,989,982 A | | 11/1999 | Yoshikazu |
| 6,107,164 A | * | 8/2000 | Ohuchi ......................... 438/110 |
| 6,159,837 A | * | 12/2000 | Yamaji et al. ............... 438/613 |
| 6,287,893 B1 | * | 9/2001 | Elenius et al. .............. 257/738 |

FOREIGN PATENT DOCUMENTS

| | | |
|---|---|---|
| EP | 0 706 208 | 4/1996 |
| EP | 0 853 337 | 7/1998 |
| JP | 08-070081 | 3/1996 |
| JP | 11-121507 | 4/1999 |
| JP | 11-224980 | 8/1999 |

OTHER PUBLICATIONS

Masatoshi Yasunaga et al: "Chip Scale Package* (CSP) A Lightly Dressed LSI Chip", Proceedings of the IEEE/CPMT International Electronics Manufacturing Technology Symposium, New York, U.S., IEEE vol. Symp. 16, pp. 169–176 XP000530088, ISBN: 0–7803–2038–7, p. 169–p. 171; Figures 1–6.

* cited by examiner

*Primary Examiner*—Kamand Cuneo
*Assistant Examiner*—Luan Thai
(74) *Attorney, Agent, or Firm*—Frishauf, Holtz, Goodman & Chick, P.C.

(57) ABSTRACT

A dicing tape is adhered to the lower surface of a silicon wafer that has pillar-shaped electrodes. The silicon wafer is cut along dicing streets, thereby making trenches among the chip-forming regions of the wafer. Next, a seal film is formed. The seal film is cut, substantially along the centerlines of the trenches. A support tape is adhered to the upper surface of the seal film. The dicing tape is peeled off. Then, those parts of the seal film that project from the lower surface of the silicon wafer are polished and removed. The support tape is peeled off. IC chips are thereby obtained. In each IC chip, the seal film covers and protects the upper surface and sides of the semiconductor substrate.

18 Claims, 20 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 11-321416, filed Nov. 11, 1999, the entire contents of which are incorporated herein by reference.

BACKGROUND OF THE INVENTION

The present invention relates to a semiconductor device and a method of manufacturing the same. More particularly, the invention relates to a semiconductor device that is sealed in resin in the form of a silicon wafer and a method of manufacturing the same.

A method of manufacturing semiconductor devices called CSPs (Chip Size Packages) will be described with reference to FIG. 17 to FIG. 20. First, as shown in FIG. 17, connection pads 2 are formed on the upper surface of a silicon wafer (semiconductor wafer) 1. An insulating film 3 is then formed, covering the upper surface of the wafer 1 and the connection pads 2, except the center part of each connection pad 2. Wirings 5 are formed, each on a limited region of the insulating film 3 and on the center part of the connection pad 2, which is exposed through an opening 4 made in the insulating film 3. Pillar-shaped electrodes or column electrodes 6 are formed, each on one end of the wiring 5. Regions 7 shown in FIG. 17 correspond to dicing streets.

Next, as shown in FIG. 18, a seal film 8 made of epoxy-based resin or the like is formed on the upper surface of the resultant structure including the pillar-shaped electrodes 6. The seal film 8 is a little thicker than the pillar-shaped electrodes 6 are tall. The seal film 8 therefore covers the pillar-shaped electrodes 6. Then, the seal film 8 is polished at its upper surface until the tops of the pillar-shaped electrodes 6 are exposed as is shown in FIG. 19. Further, the silicon wafer 1 is cut along the dicing streets 7. Chips, or semiconductor devices 9, are thereby manufactured as is illustrated in FIG. 20.

The semiconductor devices 9 have been made by cutting the silicon wafer 1 that has the seal film 8 formed on it along the dicing streets 7. The four sides of each semiconductor device 9 are therefore exposed. At the exposed sides, water or moisture may enter the interface between the insulating film 3 (protective film) and the seal film 8, and may oxidize the wirings 5 and the like. Moreover, a crack or cracks may develop in the interface between the insulation film 3 and the seal film 8.

BRIEF SUMMARY OF THE INVENTION

An object of the present invention is to provide a semiconductor device that is resin-sealed at the sides, too, which are exposed when the device is cut from a wafer.

According to an aspect of the invention there is provided a semiconductor device which comprises a semiconductor substrate and a seal film. The substrate has an upper surface, a lower surface opposing the upper surface, sides extending between the upper and lower surfaces, and a plurality of outer connection terminals formed on the upper surface. The seal film covers the upper surface of the semiconductor substrate, exposes each of the outer connection terminals at one surface, and covers the sides to at least half the thickness of the semiconductor substrate.

According to another aspect of invention there is provided a method of manufacturing a semiconductor device. The method comprises the steps of: preparing a semiconductor wafer having an upper surface, a lower surface opposing the upper surface, sides extending between the upper and lower surfaces, and a plurality of outer connection terminals formed on the upper surface; making trenches in those parts of the semiconductor wafer which lie between chip-forming regions thereof, each trench reaching at least half the thickness of the semiconductor wafer, and forming a seal film on the upper surface of the semiconductor wafer, filling the trenches and exposing the outer connection terminals at one surface; and cutting the seal film along the trenches, removing those parts of the seal film which have a smaller width than the trenches.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
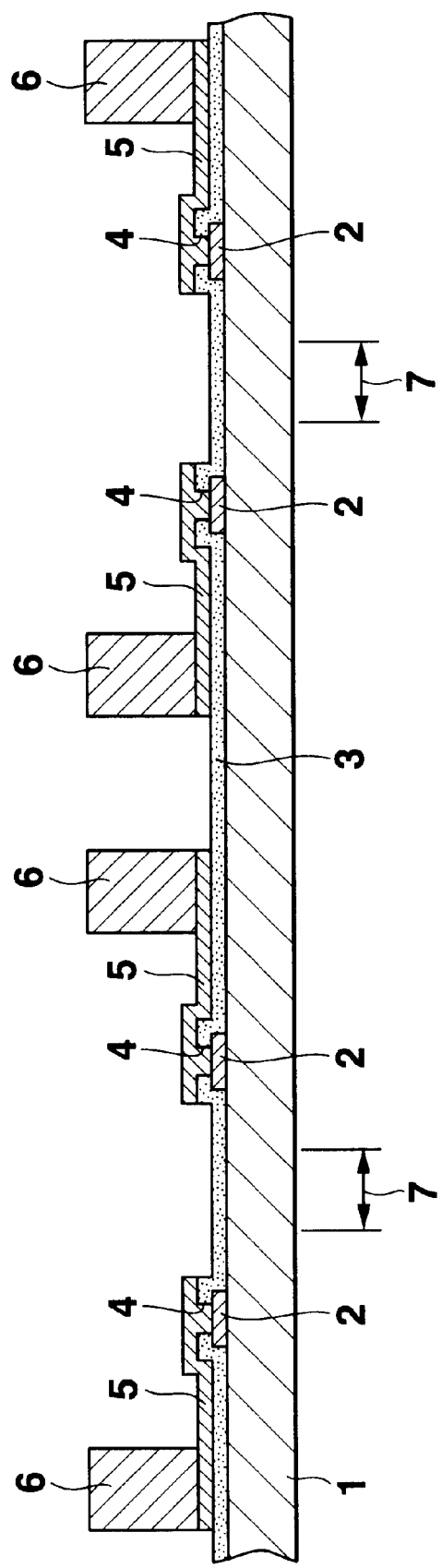
FIG. 1 is a magnified, sectional view of a silicon wafer having pillar-shaped electrodes on it, for explaining a step of a method of manufacturing a semiconductor device according to the first embodiment of the invention.

FIGS. 1 to 10 show the steps of manufacturing a semiconductor device according to the first embodiment of the present invention. With reference to the figures, the structure of the semiconductor device will be described, along with the method of manufacturing the semiconductor device. First, an unfinished product is prepared. As shown in FIG. 1, the unfinished product comprises a silicon wafer (semiconductor wafer) 1 and pillar-shaped electrodes (outer connection terminals) 6 formed on the upper surface thereof. Integrated circuits are provided in the inner area on the silicon wafer 1. More specifically, the unfinished product is prepared as follows. First, connection pads 2 are formed on the upper surface of the silicon wafer 1 and are connected to the integrated circuits provided on the silicon wafer 1. An insulating film 3 is then formed, covering the upper surface of the wafer 1 and the connection pads 2, except the center part of each connection pad 2. The insulating film 3 is formed of a single layer made of silicon oxide, silicon nitride, or the like. Alternatively, the film 3 may be a multi-layer film comprising a silicon oxide film, a silicon nitride film or the like and an organic protective film made of polyimide or the like. Wirings 5 are then formed, each on a limited region of the insulating film 3 and on the center part of the connection pad 2, which is exposed through an opening 4 made in the insulating film 3. Finally, pillar-shaped electrodes 6 (outer connection terminals) are formed, each on one end of the wiring 5. Regions 7 shown in FIG. 1 correspond to dicing streets in a shape of matrix.

Figure 2:
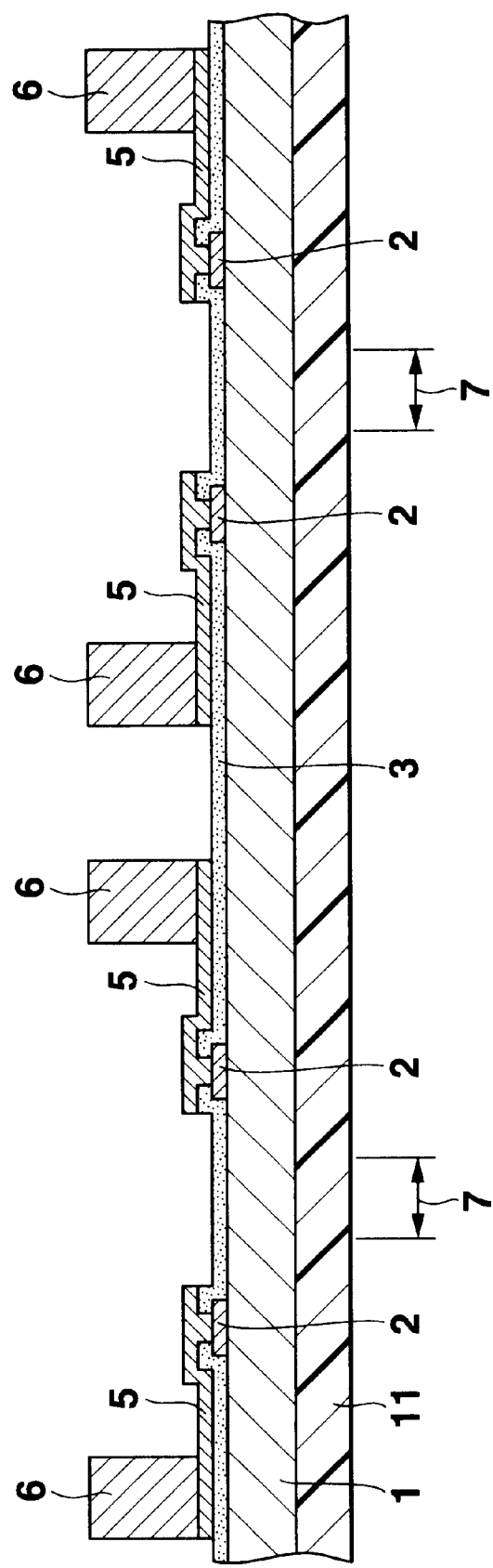
FIG. 2 is also a magnified, sectional view of the silicon wafer, explaining the step that follows the step shown in FIG. 1.
Figure 3:
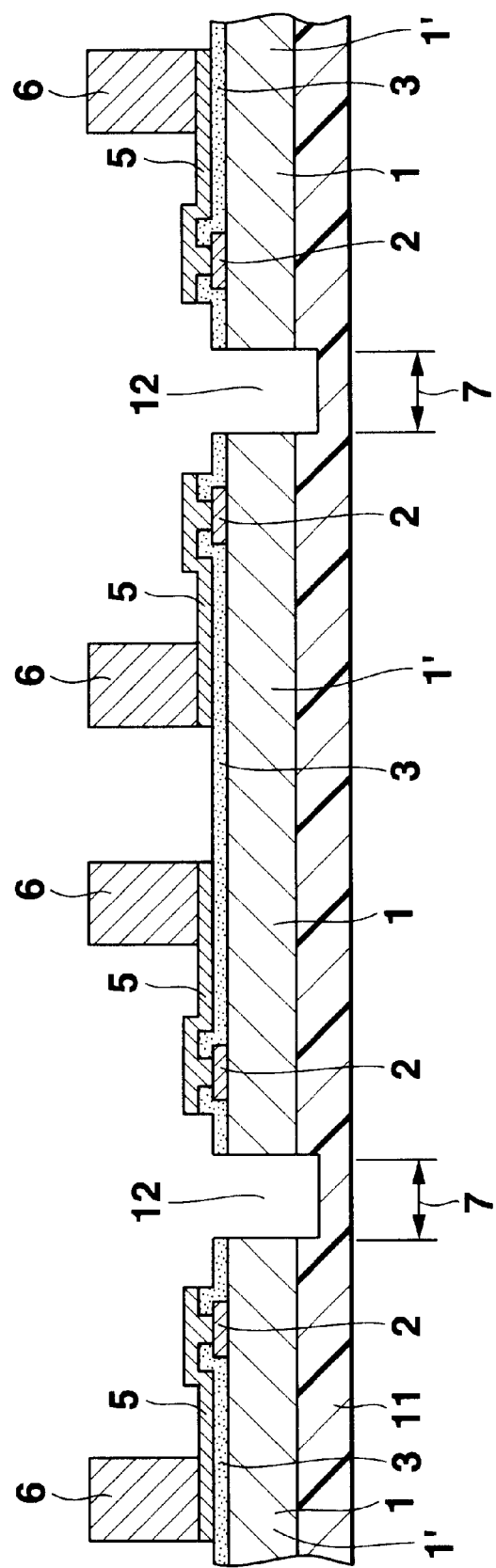
FIG. 3 is a magnified, sectional view of the silicon wafer, explaining the step that follows the step shown in FIG. 2.

Next, as shown in FIG. 2, a dicing tape 11 is adhered to the lower surface of the silicon wafer 1. The dicing tape 11 is firmly adhered to the silicon wafer 1 because its upper surface is coated with adhesive. As shown in FIG. 3, the silicon wafer 1 is cut along the dicing streets 7. In order to cut the wafer 1 completely, through its thickness, the dicing tape 11 is cut, too, in part or to half its thickness. The silicon wafer 1 is thereby cut into semiconductor substrates 1', each being a semiconductor chip. Nonetheless, the substrates 1' will be collectively called "silicon wafer 1," since the dicing tape 11 is adhered to the lower surfaces of the substrates 1', fastening the semiconductor substrates 1' together. Once the silicon wafer 1 is completely cut and the dicing tape 11 is cut in part, trenches 12 having prescribed width are formed among the semiconductor substrates 1'.

Figure 4:
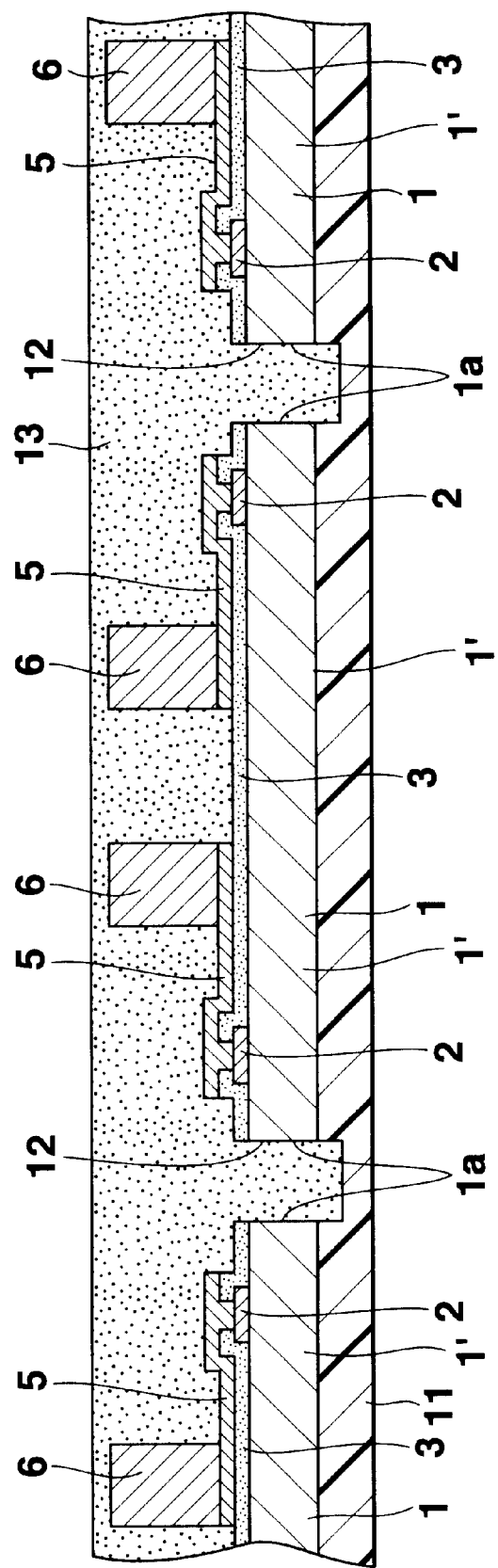
FIG. 4 is magnified, sectional view of the silicon wafer, explaining the step that follows the step shown in FIG. 3.
Figure 5:
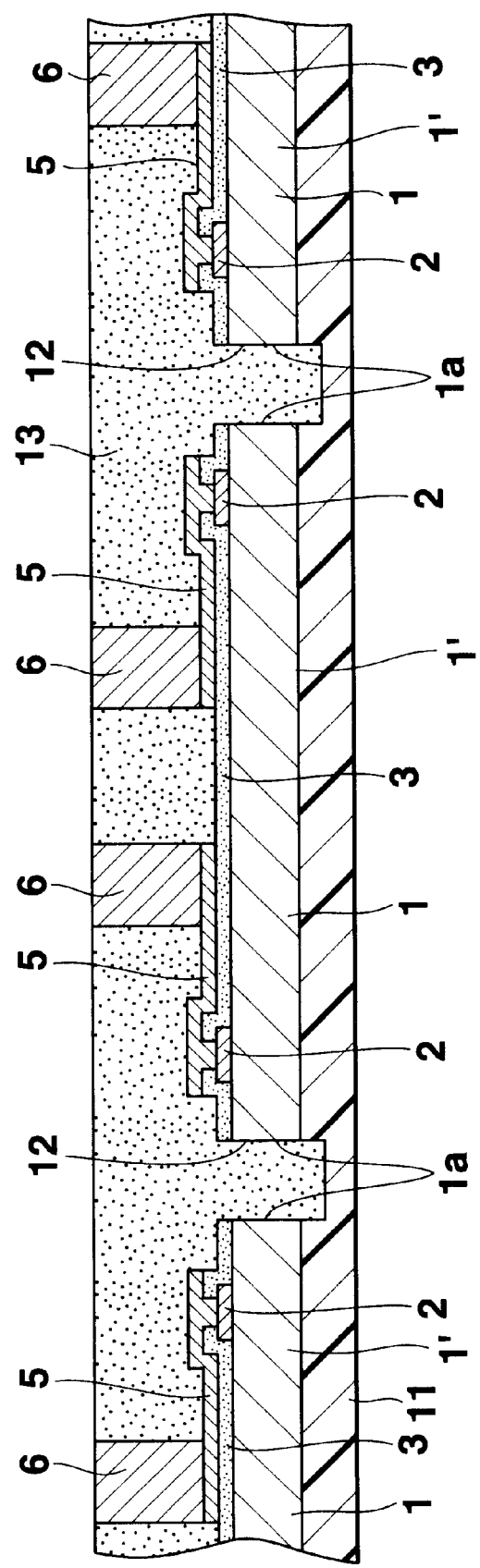
FIG. 5 is magnified, sectional view of the silicon wafer, explaining the step that follows the step shown in FIG. 4.

Thereafter, as shown in FIG. 4, a seal film 13 made of epoxy-based resin or the like is formed on the upper surface of the silicon wafer 1 having the pillar-shaped electrodes 6 and the trenches 12. The seal film 13 is a little thicker than the pillar-shaped electrodes 6 are tall. The seal film 13 therefore covers the pillar-shaped electrodes 6 and filling the trenches 12. In this condition, the seal film 13 completely covers the four sides 1a of each semiconductor substrate 1'. Then, the seal film 13 is polished at its upper surface until the tops of the pillar-shaped electrodes 6 are exposed as is shown in FIG. 5. Thereafter, the pillar-shaped electrodes 6 may be surface-treated, to form an oxidation-preventing layer on the top surface of the electrode 6.

Figure 6:
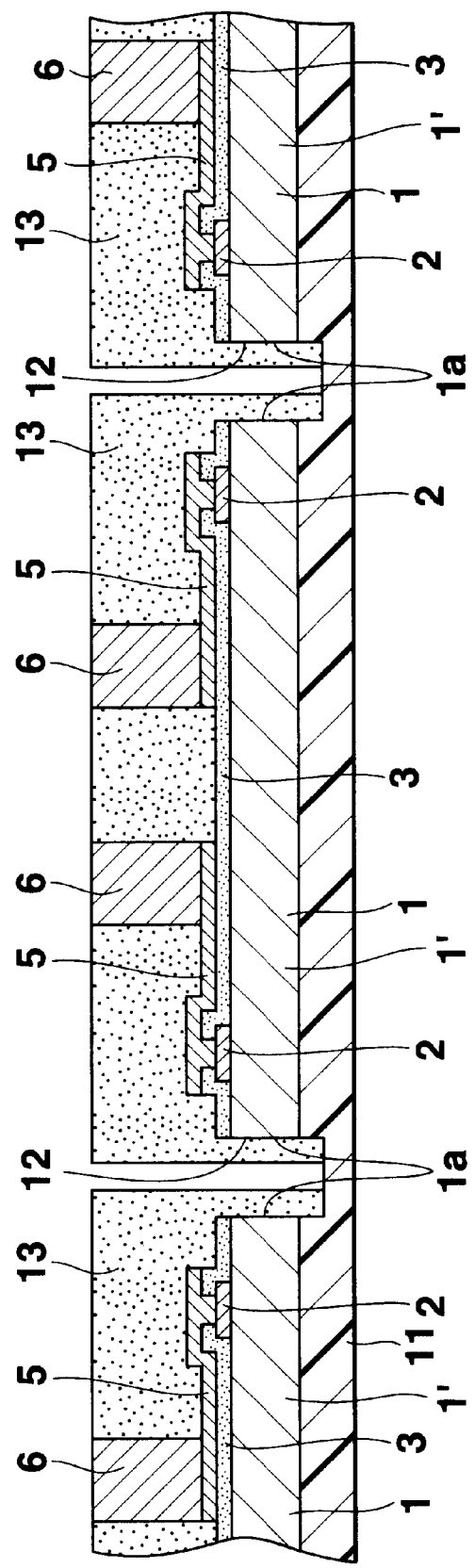
FIG. 6 is magnified, sectional view of the silicon wafer, explaining the step that follows the step shown in FIG. 5.
Figure 7:
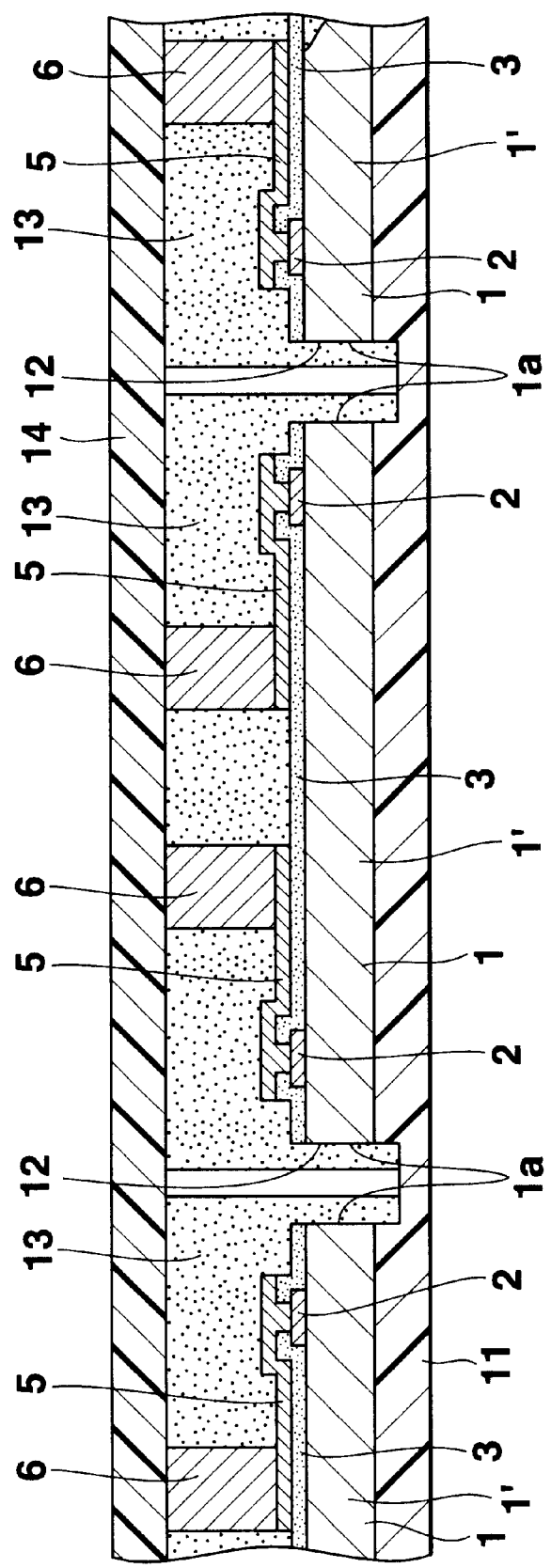
FIG. 7 is magnified, sectional view of the silicon wafer, explaining the step that follows the step shown in FIG. 6.
Figure 8:
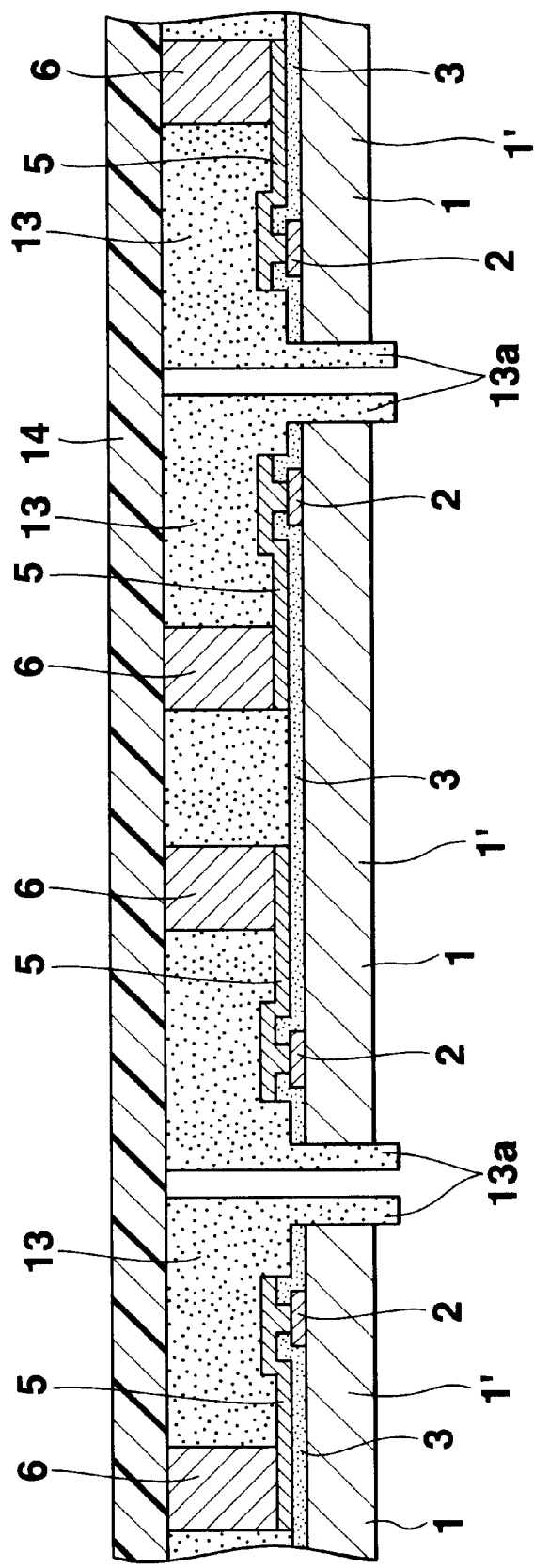
FIG. 8 is magnified, sectional view of the silicon wafer, explaining the step that follows the step shown in FIG. 7.

Next, as shown in FIG. 6, the seal film 13 is cut into segments, along the trenches 12, more precisely, substantially along the centerlines of the trenches 12. Now that the seal film 13 is thus cut, the semiconductor substrates 1' (or chips) can be separated from one another if the dicing tape 11 is completely cut. In this condition, too, the four sides 1a of each semiconductor substrate 1' remain covered with the seal film 13 provided in the trenches 12. Further, as shown in FIG. 7, a support tape 14 is adhered to the tops of segments of the seal film 13 and the tops of the pillar-shaped electrodes 6. Then, the dicing tape 11 is peeled off, whereby the structure shown in FIG. 8 is obtained. As shown in FIG. 8, each seal film segment 13 has parts 13a extending through the trenches 12 and projecting from the lower surface of the silicon wafer 1. Since the support tape 14 is adhered to the tops of the seal film segments and the tops of the pillar-shaped electrodes 6, the semiconductor substrates 1' (or chips) remain combined together.

Figure 9:
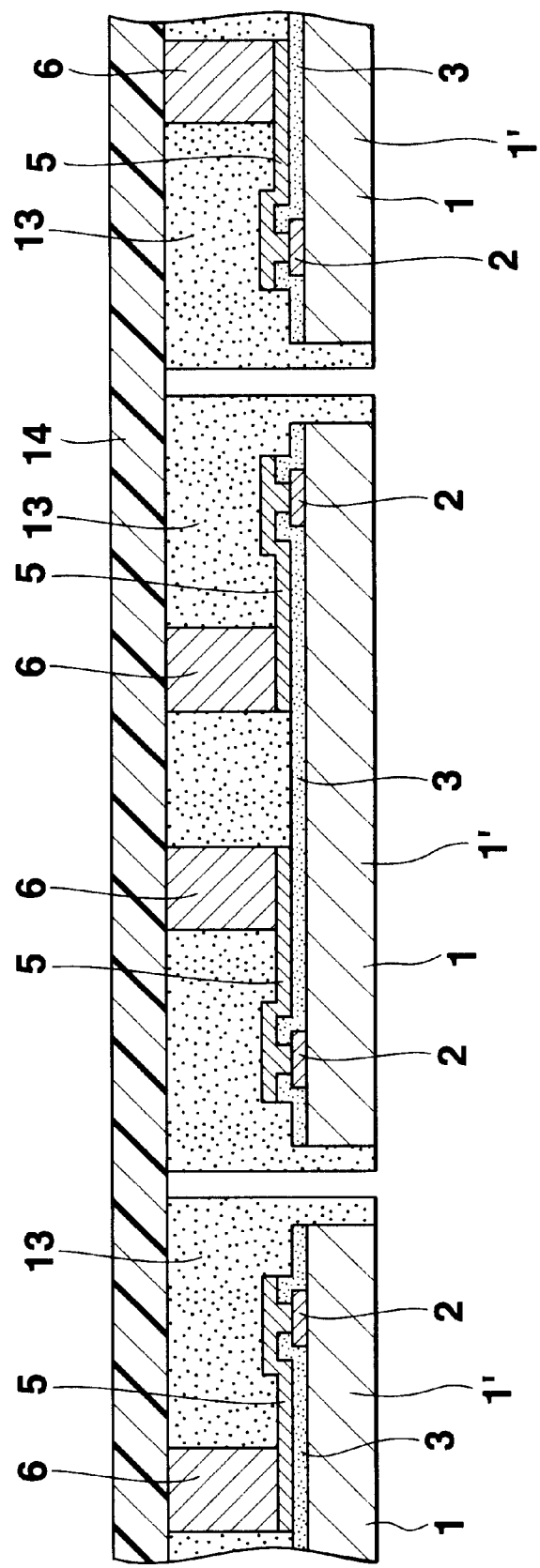
FIG. 9 is magnified, sectional view of the silicon wafer, explaining the step that follows the step shown in FIG. 8.

Then, the parts of the segments of the seal film 13, which project from the lower surface of the wafer 1 are polished and removed. The structure shown in FIG. 9 is thereby provided. Thereafter, the lower surface of the silicon wafer 1 may be polished. Finally, the support tape 14 is peeled off. As a result, semiconductor devices 15, or semiconductor chips, are manufactured as is illustrated in FIG. 10.

In each of the semiconductor devices 15 thus manufactured, the seal film (segment) 13 covers the four sides 1a of the semiconductor substrate 1'. This prevents water or moisture from entering the interface between the insulating film 3 (protective film) and the seal film 13 and may oxidize the wirings 5 and the like. Moreover, a crack hardly develops in the interface between the insulation film 3 and the seal film 13.

Figure 11:
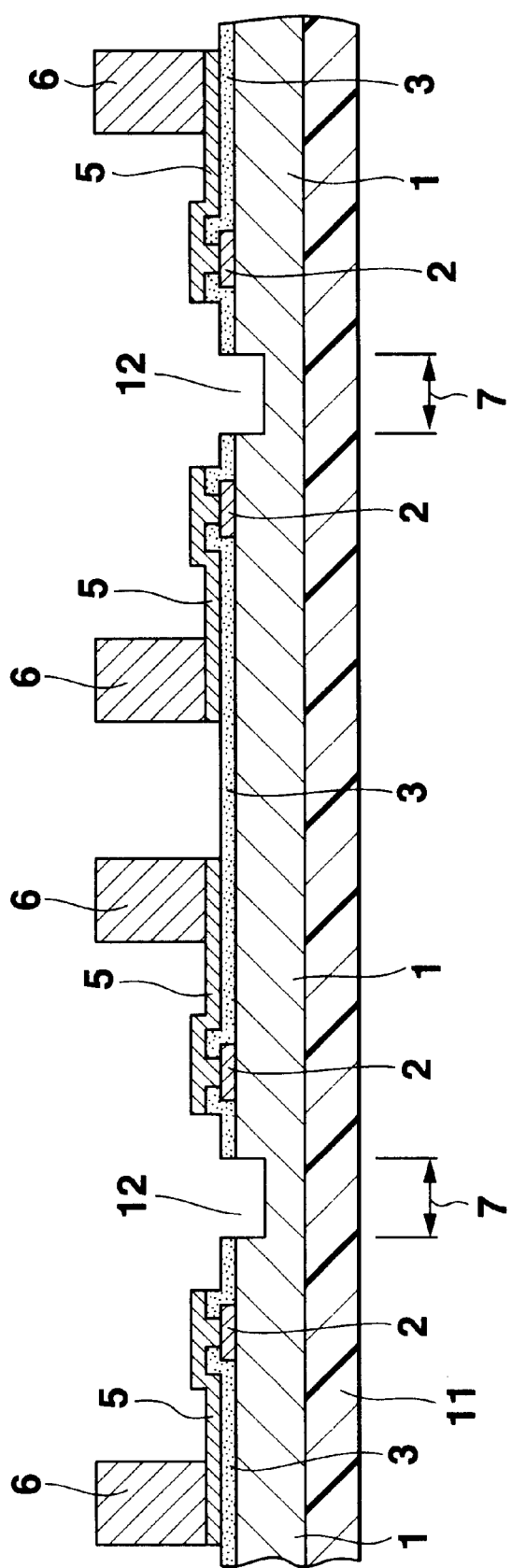
FIG. 11 is a magnified, sectional view of a silicon wafer, explaining a step of a method of manufacturing a semiconductor device that is the second embodiment of this invention.
Figure 12:
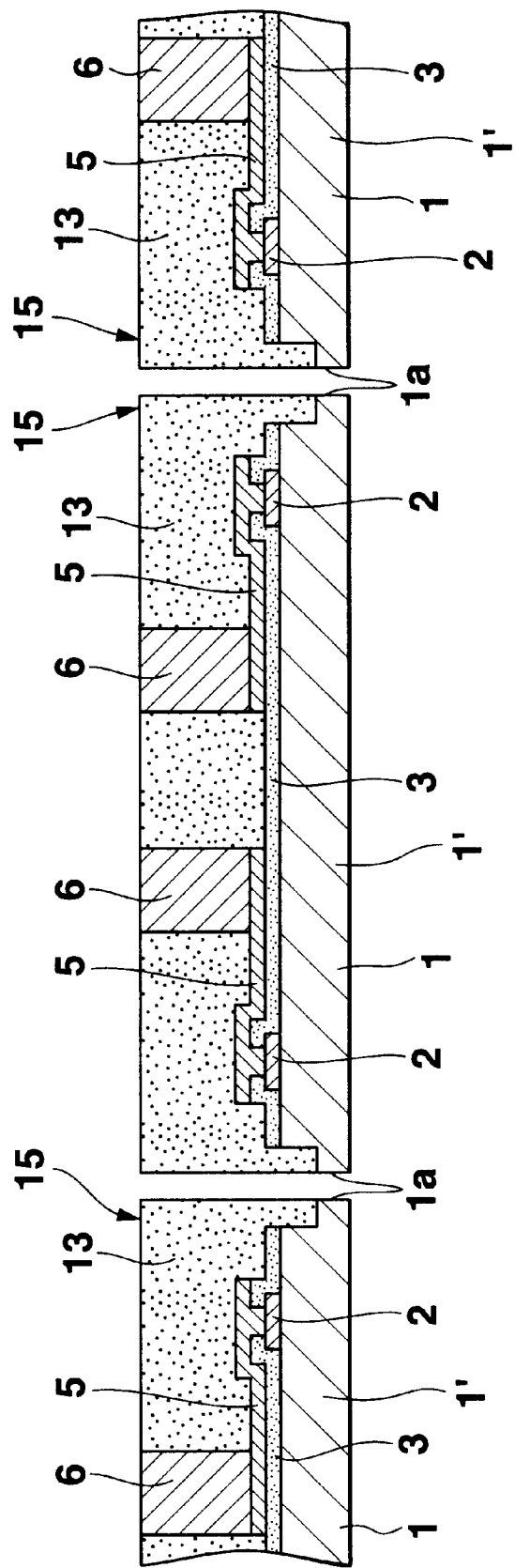
FIG. 12 is a magnified, sectional view of the silicon wafer, explaining the step that follows the step shown in FIG. 11.

FIG. 11 and FIG. 12 are cross sectional views explaining a method of manufacturing a semiconductor device according to the second embodiment of the invention. In this method, a silicon wafer 1 is cut at its upper surface, but only to half its thickness, along dicing streets 7, as is illustrated in FIG. 11. In other words, U-trenches 12 are made in the upper surface of the silicon wafer 1, at those regions of the wafer 1 which correspond to dicing streets 7. Thereafter, a seal film 13 is formed in the same way as in the first embodiment. Then, as shown in FIG. 12, the seal film 13 and the silicon wafer 1 are cut along the dicing streets 7, thereby providing semiconductor devices 15 (or semiconductor chips). In the second embodiment, the four sides 1a of each semiconductor substrate 1' are covered with the seal film 13, from the upper edge of the substrate 1' to half the thickness of the substrate 1'.

Figure 10:
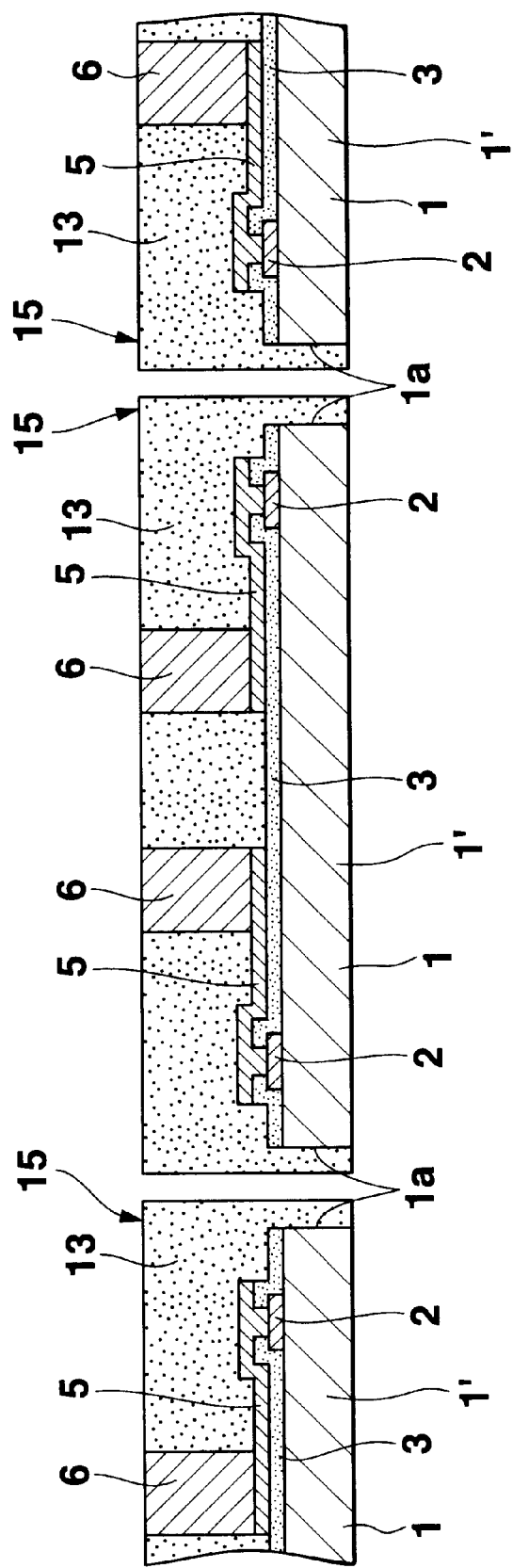
FIG. 10 is magnified, sectional view of the silicon wafer, explaining the step that follows the step shown in FIG. 9.

In the semiconductor device 15 made by the first embodiment, each side 1a of the semiconductor substrate 1' is a vertical surface, which is entirely covered with the seal film 13 as is illustrated in FIG. 10. In the semiconductor device made by the second embodiment, each side 1a of the semiconductor substrate 1' comprises a lower vertical surface, an upper vertical surface and a horizontal surface extending between the vertical surfaces and positioned under the interface between the films 3, 13, as is illustrated in FIG. 12. Of these three surfaces, the upper vertical surface and the horizontal surface are covered with the seal film 13. Hence, water or moisture is prevented from entering the interface between the insulating film 3 and the seal film 13, and a crack hardly develop in the interface between the insulation film 3 and the seal film 13, as in the semiconductor device manufactured by the first embodiment.

Figure 13:
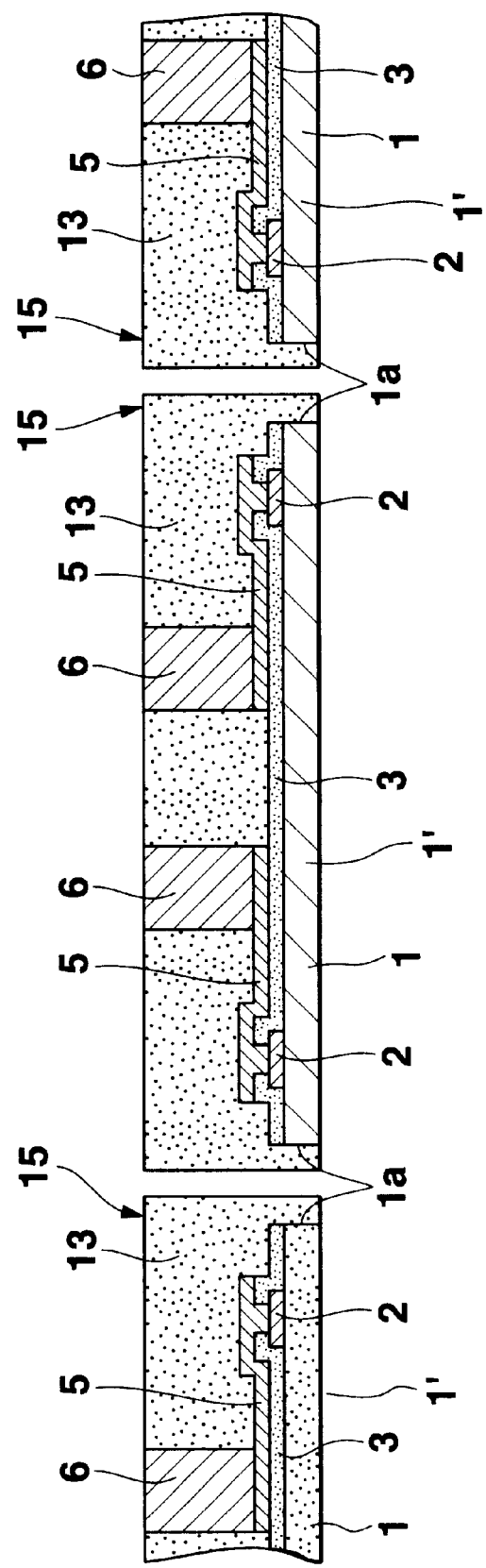
FIG. 13 is a magnified, sectional view of a silicon wafer, explaining a step of a method of manufacturing a semiconductor device that is the third embodiment of this invention.

FIG. 13 is a sectional view explaining a method of manufacturing a semiconductor device according to the third embodiment of the invention. As in the first embodiment, each side 1a of the semiconductor substrate 1' is a vertical surface, which is entirely covered with the seal film 13. In the third embodiment, however, the semiconductor substrate 1' is thinner than in the first embodiment. The semiconductor devices 15 shown in FIG. 13 can be made by the method of the second embodiment. More precisely, U-trenches 12 are made in the upper surface of the silicon wafer 1 as shown in FIG. 11, and a seal film 13 is then formed and filling the U-trenches 12 but not covering the pillar-shaped electrodes 6, as is illustrated in FIG. 12. Then, the silicon wafer 1 is polished, at its lower surface, to the bottoms of the U-trenches. Semiconductor substrates 1' are thereby provided. Each semiconductor substrate 1' thus provided has its four sides 1a covered with the seal film 13. Thereafter, the seal film 13 is cut along the U-trenches 12 of the substrate 1'. As a result, semiconductor devices 15 are obtained, as is illustrated in FIG. 13.

Figure 14:
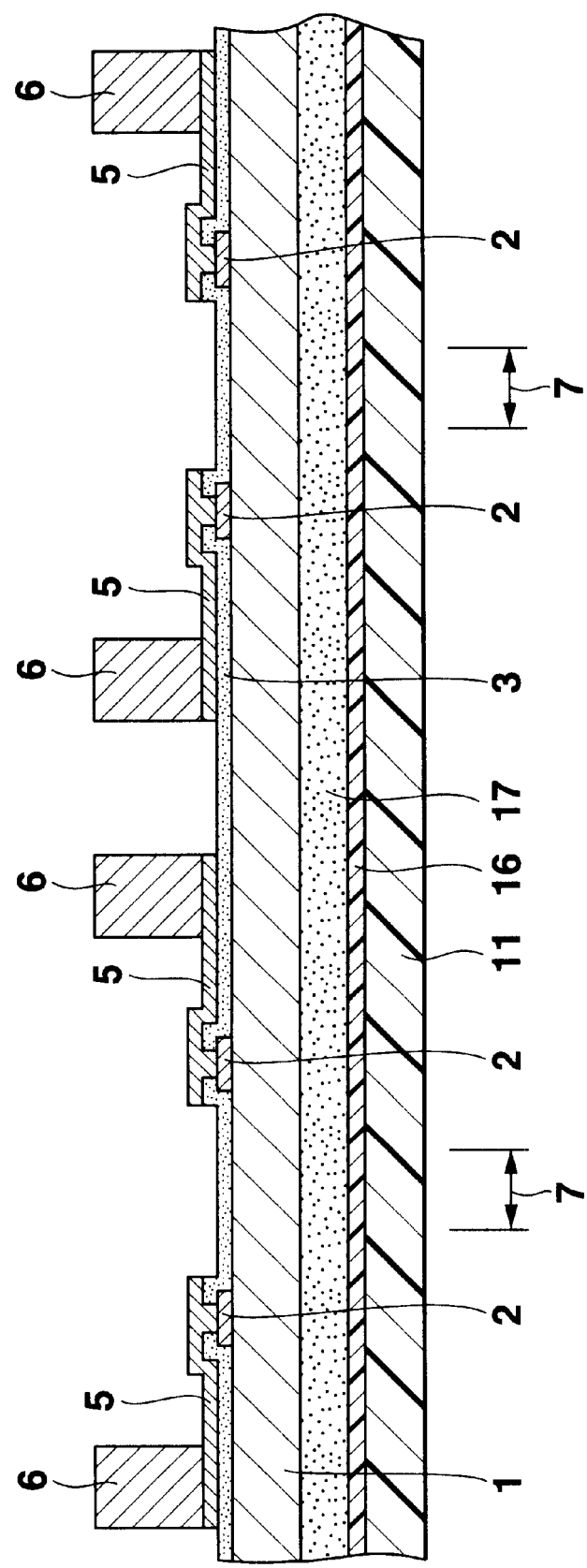
FIG. 14 is a magnified, sectional view of a silicon wafer, explaining a step of a method of manufacturing a semiconductor device that is the fourth embodiment of the invention.
Figure 15:
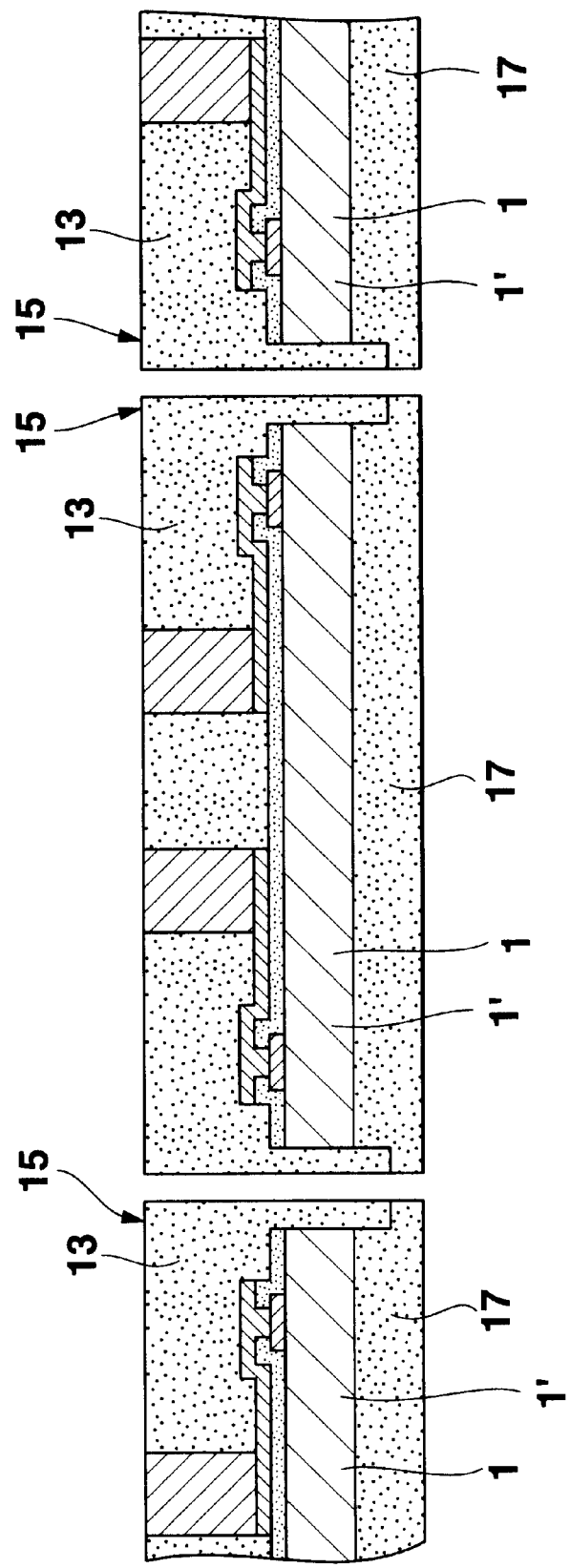
FIG. 15 is a magnified, sectional view of the silicon wafer, explaining the step that follows the step explained in FIG. 14.

FIG. 14 and FIG. 15 are sectional views explaining a step of a method of manufacturing a semiconductor device according to the fourth embodiment of the present invention. In this method, a seal film 17 made of epoxy-based resin or the like is formed on the lower surface of a silicon wafer 1 as is shown in FIG. 14. A peel layer 16 is formed on the lower surface of the seal film 17. Further, a dicing tape 11 is adhered to lower surface of the peel layer 16. Then, the silicon wafer 1 is cut along dicing streets 7, to half the thickness of the seal film 17 or to the lower surface of the seal film 17. Semiconductor substrates 1', or semiconductor chips, are thereby obtained as is shown in FIG. 15. Thereafter, a seal film 13 is formed on the silicon wafer 1, filling the gaps between the semiconductor substrates 1'. As a result, the upper surface, lower surface and four sides 1a of each semiconductor substrate 1' are covered with the seal films 13 and 17, as is illustrated in FIG. 15. Then, the seal film 13 is cut, removing those parts corresponding to the dicing streets 7 and having a smaller width than the gaps the semiconductor substrates 1'. Semiconductor devices 15 are thereby made as is shown in FIG. 15. In the fourth embodiment, each semiconductor substrate 1' is covered not only at the upper surface and four sides 1a, but also at the lower surface with integrated films 13, 17. The seal film 17 is cut, together with the seal film 13. Since the lower surface of the substrate 1' is covered with the seal film 17, the substrate 1' is protected from light and electromagnetic waves applied to the lower surface of the silicon substrate 1'. In the fourth embodiment, the silicon wafer 1 may be polished at its lower surface, in order to reduce the thickness of the semiconductor devices 15.

Figure 16:
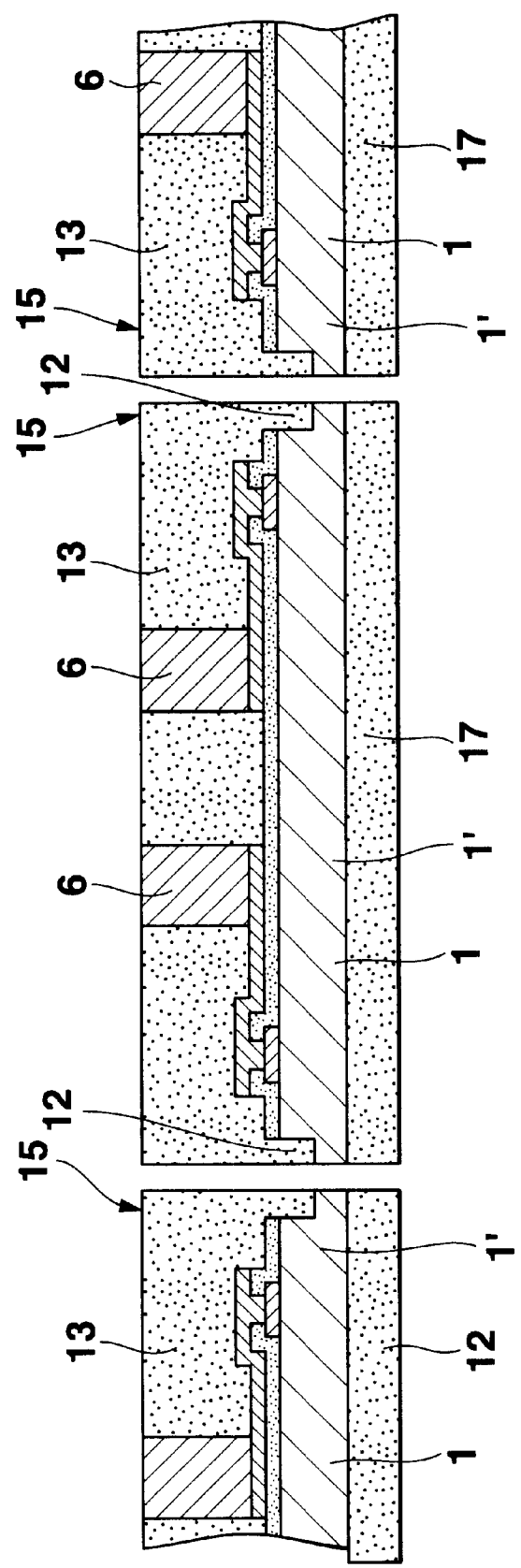
FIG. 16 is a magnified, sectional view of a silicon wafer, explaining a step of a method of manufacturing a semiconductor device that is the fifth embodiment of the invention.
Figure 17:
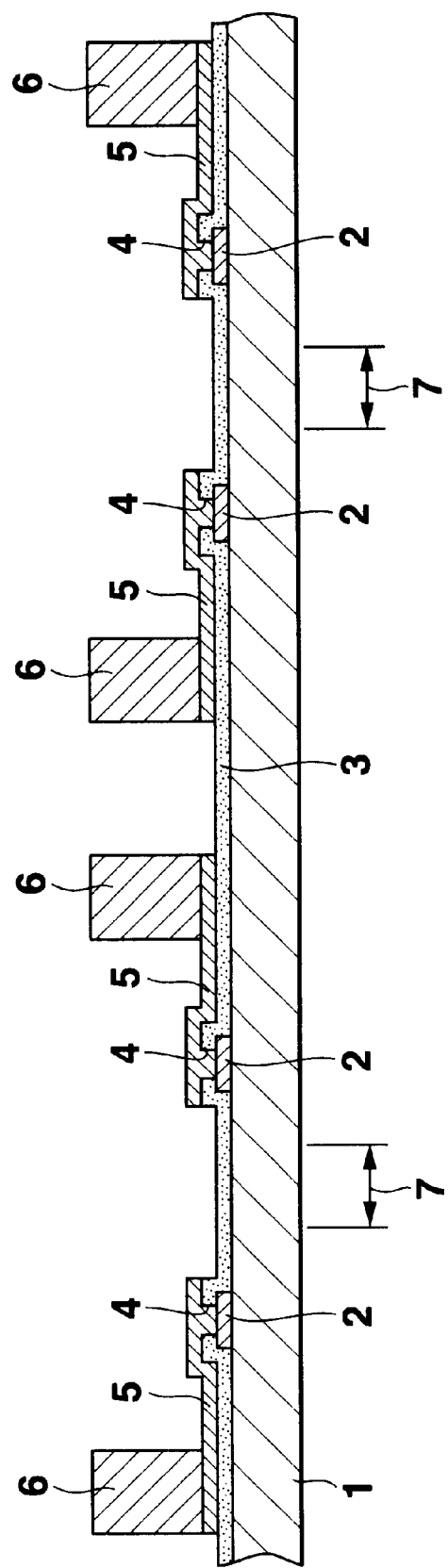
FIG. 17 is a magnified, sectional view of a silicon wafer, explaining a conventional method of manufacturing a semiconductor device.
Figure 18:
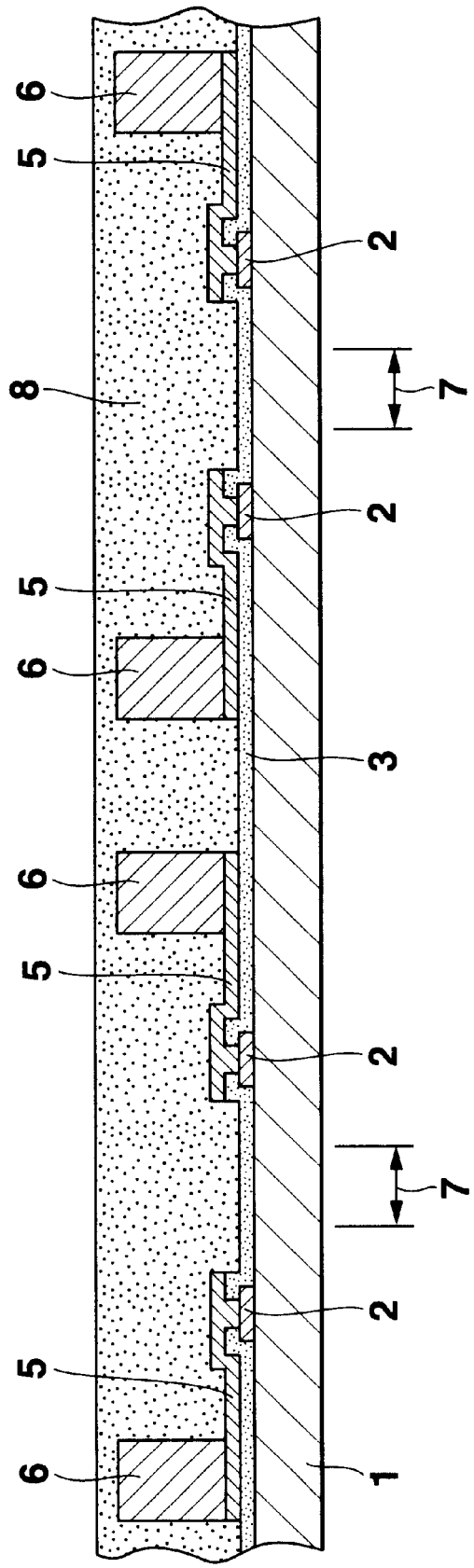
FIG. 18 is a magnified, sectional view of the silicon wafer, explaining the step that follows the step shown in FIG. 17.
Figure 19:
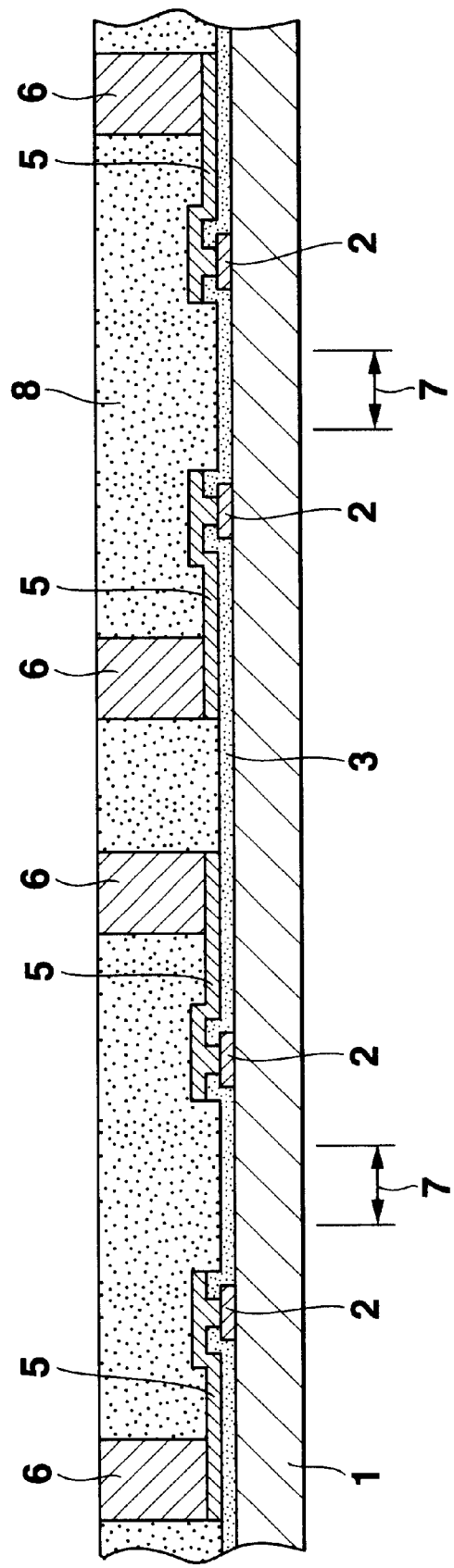
FIG. 19 is a magnified, sectional view of the silicon wafer, explaining the step that follows the step shown in FIG. 18.
Figure 20:
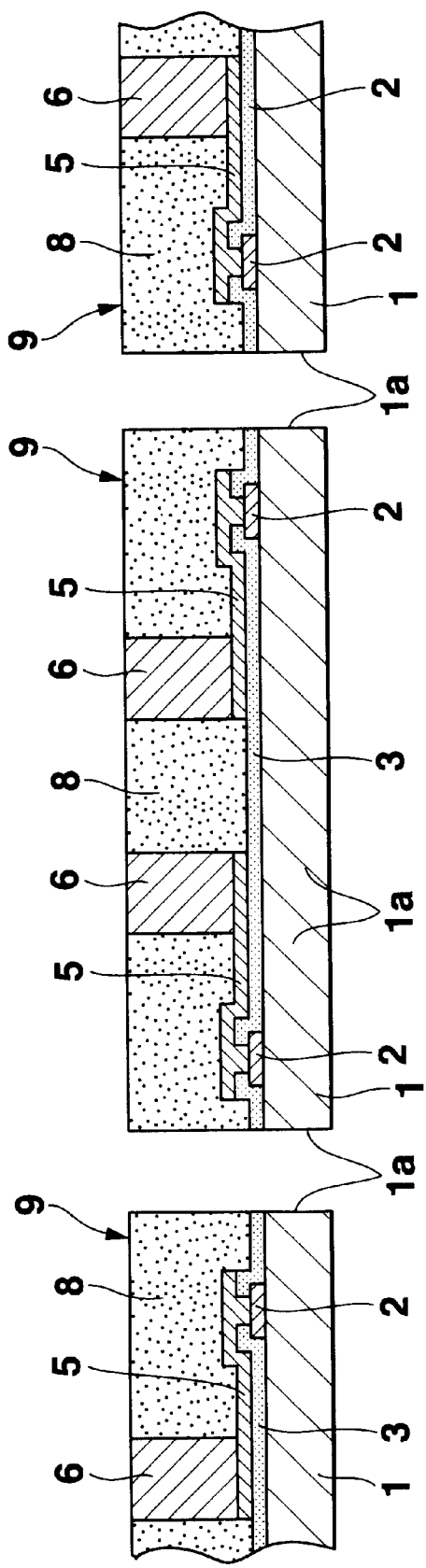
FIG. 20 is a magnified, sectional view of the silicon wafer, explaining the step that follows the step shown in FIG. 19.

FIG. 16 is a sectional view explaining a method of manufacturing a semiconductor device according to the fifth embodiment of the invention.

In the fifth embodiment, a seal film 17 is formed on the lower surface of a silicon wafer 1. Then, U-trenches 12 are made in the upper surface of the silicon wafer 1, by cutting the wafer 1 from the upper surface to half the thickness of the wafer 1. A seal film 13 is formed on the upper surface of the silicon wafer 1 such that the tops of pillar-shaped electrodes 6 remain exposed. At this time, the seal film 13 fills the U-trenches in the wafer. Thereafter, the seal film 13, silicon wafer 1 and seal film 17 are integrally cut, thus removing those parts corresponding to the dicing streets 7 and having a smaller width than that of the U-trench. Semiconductor devices 15 are thereby made. In the fifth embodiment, it is desired that a dicing tape (not shown in FIG. 16) be kept adhered to the seal film 17 until the silicon wafer 1 are cut to provide semiconductor devices 15.

In any embodiment described above, a seal film is formed on a silicon wafer 1 that has connection pads 2, wirings 5 connected to the pads 2 and pillar-shaped electrodes 6 provided on the wirings 5. Instead, no wirings 5 may be formed, and the seating film may be formed on the assembly including the pillar-shaped electrodes 6 formed directly on the connection pads 2. Moreover, the pillar-shaped electrodes 6 may be outer connection terminals, which are connected to the connection pads 2 by means of wire bonding. If this is the case, it suffices to make openings in the seal film, thus exposing the connection pads 2.

As has been described above, the side of each silicon substrate is covered with a seal film, at least at their upper part, in the present invention. Thus, at least the upper part of the side is never exposed. This reliably protects the side of each silicon substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

preparing a semiconductor wafer having an upper surface including chip-forming regions, a lower surface opposing the upper surface, sides extending between the upper and lower surfaces, and a plurality of outer connection terminals formed on the upper surface;

making trenches in parts of the semiconductor wafer which lie between the chip-forming regions, each trench successively extending to half a thickness of the semiconductor wafer from the upper surface of the semiconductor wafer;

forming a first seal film on the upper surface of the semiconductor wafer in a manner such that the trenches are filled and such that a top surface of each of the outer connection terminals is exposed;

forming a second seal film on the lower surface of the semiconductor wafer; and cutting the first seal film along the trenches by removing parts of the first seal film having a smaller width than the trenches such that the semiconductor wafer is separated into individual semiconductor devices, each of which has the first seal film provided on an upper surface thereof and on an upper part of a periphery thereof while leaving a lower part of the periphery thereof exposed, and each of which has the second seal film provided on the lower surface thereof.

2. The method according to claim 1, further comprising:

adhering a dicing tap to the semiconductor wafer before the trenches are made in the semiconductor wafer.

3. The method according to claim 2, further comprising:
adhering a support tape to an upper surface of the first seal film after the first seal film is cut; and
peeling the dicing tape from the semiconductor wafer.

4. The method according to claim 1, further comprising:
polishing the lower surface of the semiconductor wafer before the second seal film is formed on the lower surface of the semiconductor wafer, thereby reducing a thickness of the semiconductor wafer.

5. The method according to claim 1, further comprising:
polishing the lower surface of the semiconductor wafer to reach up to the trenches.

6. The method according to claim 1, wherein the first seal film is first formed on the upper surface of the semiconductor wafer so as to cover the top surface of each of the outer connection terminals, and wherein an upper surface of the first seal film is then polished until the top surface of each of the outer connection terminals is exposed.

7. A method of manufacturing a semiconductor device comprising:
preparing a semiconductor wafer having an upper surface including chip-forming regions, a lower surface opposing the upper surface, sides extending between the upper and lower surfaces, and a plurality of outer connection terminals formed on the upper surface;
forming a rear seal film on the lower surface of the semiconductor wafer;
adhering a dicing tape to a lower surface of the second seal film;
making trenches in parts of the semiconductor wafer which lie between the chip-forming regions, each trench successively extending from the upper surface of the semiconductor wafer to half a thickness of the dicing tape so as to form concavities in an upper portion of the dicing tape;
forming a front seal film on the upper surface of the semiconductor wafer in a manner such that the trenches are filled and such that a top surface of each of the outer connection terminals is exposed; and
cutting the front seal film along the trenches by removing parts of the front seal film having a smaller width than the trenches such that the semiconductor wafer is separated into individual semiconductor devices, each of which has the front seal film provided on an upper surface thereof and on an entire surface of a periphery thereof, and each of which has the rear seal film provided on the lower surface thereof.

8. The method according to claim 7, wherein the first seal film is formed so as to fill in the concavities in the upper portion of the dicing film.

9. The method according to claim 8, further comprising:
peeling off the dicing tape from the semiconductor film; and
removing the first seal film from the concavities in the upper portion of the dicing film.

10. A method of manufacturing a semiconductor device comprising:
preparing a semiconductor wafer having an upper surface including chip forming regions, a lower surface opposing the upper surface, sides extending between the upper and lower surfaces, and a plurality of connection pads formed on the upper surface;
forming on the upper surface of the semiconductor wafer an insulating film having openings such that the upper surface of the semiconductor wafer is covered and the connection pads are exposed via the openings;
forming on the insulating film wirings connected to the connection pads;
forming pillar-shaped electrodes on the wirings;
adhering a dicing tape to the lower surface of the semiconductor wafer;
making trenches in parts of the semiconductors wafer which lie between the chip-forming regions, each trench successively extending from the upper surface of the semiconductor wafer to half a thickness of the dicing tape so as to form concavities in an upper portion of the dicing tape;
forming a seal film on the upper surface of the semiconductor wafer in a manner such that the trenches are filled and such that a top surface of each of the pillar-shaped electrodes is exposed; and
cutting the seal film along the trenches by removing parts of the seal film having a smaller width than the trenches such that the semiconductor wafer is separated into individual semiconductor devices, each of which has the seal film provided on an upper surface thereof and on a periphery thereof, wherein a portion of the seal film provided on the periphery projects from a lower surface of the semiconductor devices.

11. The method according to claim 10, further comprising:
forming another seal film on the lower surface of the semiconductor wafer, before cutting the seal film along the trenches.

12. The method according to claim 10, wherein the seal film is first formed on the upper surface of the semiconductor wafer so as to cover the top surface of each of the pillar-shaped electrodes, and wherein an upper surface of the seal film is then polished until the top surface of each of the pillar-shaped electrodes is exposed.

13. A method of manufacturing a semiconductor device comprising:
preparing a semiconductor wafer having an upper surface including chip forming regions, a lower surface opposing the upper surface, a thickness between the upper and lower surfaces, and a plurality of pillar-shaped electrodes formed on the upper surface;
adhering a dicing tape to the lower surface of the semiconductor wafer;
making trenches by cutting parts of the semiconductor wafer which lie between the chip-forming regions, each trench successively extending to half a thickness of the dicing tape through the thickness of the semiconductor wafer from the upper surface of the semiconductor wafer;
forming a seal film on the upper surface of the semiconductor wafer so as to fill in the trenches and cover the pillar-shaped electrodes;
polishing an upper surface of the seal film until a top surface of each of the pillar-shaped electrodes is exposed;
cutting the seal film along the trenches by removing parts of the seal film having a smaller width than the trenches;
adhering a support tape to the upper surface of the seal film after cutting the seal film along the trenches;
peeling off the dicing tape from the lower surface of the semiconductor wafer after adhering the support tape to the upper surface of the seal film, and
polishing the lower surface of the semiconductor wafer after peeling off the dicing tape.

14. The method according to claim 13, wherein cutting of the seal film is terminated at a position such that a full thickness of the dicing tape is not cut.

15. The method according to claim 14, further comprising:

obtaining individual semiconductor devices separated from one another by peeling off the support tape.

16. A method of manufacturing a semiconductor device comprising:

preparing a semiconductor wafer having an upper surface including chip forming regions, a lower surface opposing the upper surface, a thickness between the upper and lower surfaces, and a plurality of pillar-shaped electrodes formed on the upper surface;

forming a rear seal film on the lower surface of the semiconductor wafer;

making trenches by cutting in parts of the semiconductor wafer which lie between the chip-forming regions, each trench successively extending to half a thickness of the rear seal film through the a thickness of the semiconductor wafer from the upper surface of the semiconductor wafer;

forming a front seal film on the upper surface of the semiconductor wafer so as to cover the upper surface of the semiconductor wafer while leaving a top surface of each of the pillar-shaped electrodes exposed, and so as to fill in the trenches and thereby entirely enclose each of the chip-forming regions within the front seal film and the rear seal film; and cutting the front seal film along the trenches by removing parts of the front seal film having a smaller width than the trenches such that the semiconductor wafer is separated into individual devices, each of which has the front seal film provided on the upper surface thereof and on a periphery thereof, and each of which has the rear seal film provided on the lower surface thereof.

17. The method according to claim 16, further comprising:

adhering a tape to the rear seal film before making the trenches.

18. The method according to claim 16, wherein the front seal film is first formed on the upper surface of the semiconductor wafer so as to cover the top surface of each of the pillar-shaped electrodes, and wherein an upper surface of the first seal film is then polished until the top surface of each of the pillar-shaped electrodes is exposed.

* * * * *